(12) United States Patent
Chatain et al.

(10) Patent No.: US 11,325,153 B2
(45) Date of Patent: May 10, 2022

(54) CONTROL CIRCUIT FOR ULTRASONIC TRANSDUCERS

(71) Applicant: MODULEUS, Tours (FR)

(72) Inventors: Pascal Chatain, Chambray-les-Tours (FR); Mathieu Roy, Joue-les-Tours (FR); Etienne Flesch, Andresy (FR); Edgard Jeanne, Tours (FR)

(73) Assignee: MODULEUS, Tours (FR)

( * ) Notice: Subject to any disclaimer, the term of this patent is extended or adjusted under 35 U.S.C. 154(b) by 359 days.

(21) Appl. No.: 16/475,490

(22) PCT Filed: Jan. 2, 2018

(86) PCT No.: PCT/FR2018/050003
§ 371 (c)(1),
(2) Date: Jul. 2, 2019

(87) PCT Pub. No.: WO2018/127655
PCT Pub. Date: Jul. 12, 2018

(65) Prior Publication Data
US 2019/0337014 A1  Nov. 7, 2019

(30) Foreign Application Priority Data
Jan. 4, 2017 (FR) ..................... 17/50071

(51) Int. Cl.
*B06B 1/02* (2006.01)
*H03F 3/45* (2006.01)

(52) U.S. Cl.
CPC ....... *B06B 1/0215* (2013.01); *H03F 3/45475* (2013.01); *H03F 2200/129* (2013.01);
(Continued)

(58) Field of Classification Search
CPC ....... B06B 1/0215; B06B 1/20; B06B 1/0207; H03F 3/45475; H03F 2200/129;
(Continued)

(56) References Cited

U.S. PATENT DOCUMENTS 6,645,145 B1 11/2003 Dreschel et al.
2005/0154300 A1 7/2005 Wodnicki et al.
(Continued)

FOREIGN PATENT DOCUMENTS

WO 2009/073743 A1 6/2009

OTHER PUBLICATIONS

English Translation of the Written Opinion of the International Searching Authority issued in corresponding PCT application No. PCT/FR2018/050003, dated Apr. 20, 2018, 6 pp.
(Continued)

*Primary Examiner* — Jung Kim
(74) *Attorney, Agent, or Firm* — Kaplan Breyer Schwarz, LLP

(57) ABSTRACT

A circuit of control of ultrasound transducers, is configurable according to the type of transducers to be controlled, and includes a first terminal intended to be coupled to a first electrode of each of the transducers, and a bias switch configurable to couple the first terminal to one or the other of first and second bias nodes according to the type of transducers to be controlled.

14 Claims, 3 Drawing Sheets

(52) U.S. Cl.
CPC ................ *H03F 2200/294* (2013.01); *H03F 2203/45116* (2013.01); *H03F 2203/45512* (2013.01); *H03F 2203/45528* (2013.01)

(58) Field of Classification Search
CPC ..... H03F 2200/294; H03F 2203/45116; H03F 2203/45512; H03F 2203/45528; H03K 19/018585
See application file for complete search history.

(56) References Cited

U.S. PATENT DOCUMENTS

| | | |
|---|---|---|
| 2011/0201936 A1 | 8/2011 | Miyajima |
| 2014/0276075 A1* | 9/2014 | Blalock ................ A61B 8/4483 600/459 |

OTHER PUBLICATIONS

Authorized Officer: Kassner, Holger, International Search Report issued in PCT application No. PCT/FR2018/050003, dated Apr. 20, 2018, 2 pp.
Office Action issued in counterpart European patent application No. 18701511.0, dated Oct. 25, 2021, 7 pp. w/ translation.

* cited by examiner

CONTROL CIRCUIT FOR ULTRASONIC TRANSDUCERS

The present patent application claims the priority benefit of French patent application FR17/50071 which is herein incorporated by reference.

BACKGROUND

The present application relates to ultrasound imaging, and more particularly aims at an electronic circuit intended to control ultrasound transducers of an ultrasound imaging system.

DISCUSSION OF THE RELATED ART

An ultrasound imaging system conventionally comprises a plurality of ultrasound transducers, for example, arranged in a linear array or in a matrix array. In operation, the transducer assembly is arranged opposite a body which is desired to be imaged. The system further comprises an electronic control circuit capable of applying electric excitation signals to the transducers, to cause the emission of ultrasound waves by the transducers. The ultrasound waves emitted by the transducers are reflected by the body to be analyzed (by its internal and/or surface structure), and then return to the transducers, which convert them back into electric signals. The electric response signals are read by the electronic control circuit and may be stored and analyzed to deduce therefrom information relative to the studied body.

Conventional ultrasound imaging systems are relatively complex and expensive systems, for example used in the medical field (ultrasound scan) or for industrial applications (non-destructive control of materials). More recently, consumer applications have been provided, where an ultrasound transducer sensor is used to acquire a user's biometric signature, for example, a fingerprint. As compared with optical-type biometric sensors, an advantage is an improvement of the reliability of the identification, particularly due to the integration of information relative to the inner structure of the body part (finger, palm, etc.) used for the identification.

It would be desirable to at least partly improve certain aspects of existing ultrasound imaging systems. In particular, it would be desirable to be able to decrease the cost of such systems, and particularly the cost due to the transducer control electronic circuit. This is all the more important for consumer applications, where the cost of the transducer control electronic circuit may be a significant part of the total cost of the system.

SUMMARY

Thus, an embodiment provides an ultrasound transducer control circuit, characterized in that it is configurable according to the type of transducers to be controlled.

According to an embodiment, the control circuit comprises a first terminal intended to be coupled to a first electrode of each of the transducers, and a bias switch configured to couple the first terminal to one or the other of first and second bias nodes according to the type of transducers to be controlled.

According to an embodiment, the first bias node is an output node of a DC bias voltage supply circuit and the second bias node is a node of application of a reference potential of the circuit.

According to an embodiment, the circuit intended to supply a DC bias voltage comprises a DC/DC voltage converter configurable to modify the level of the bias voltage that it delivers.

According to an embodiment, the control circuit comprises a plurality of second terminals intended to be respectively coupled to second electrodes of the transducers to be controlled.

According to an embodiment, the control circuit comprises a plurality of voltage pulse generators, each of the second terminals being coupled to one of the voltage pulse generators.

According to an embodiment, the voltage level of the voltage pulses delivered by the pulse generators is configurable.

According to an embodiment, the control circuit further comprises a receive circuit comprising an input node, a receive amplifier having its input coupled to the input node, an analog-to-digital converter having its input coupled to the output of the receive amplifier, and an output coupled to the output of the analog-to-digital converter.

According to an embodiment, the control circuit comprises a plurality of switches respectively coupling the second terminals to the input node of the receive circuit.

According to an embodiment, the receive circuit comprises an impedance matching circuit configurable according to the type of transducers to be controlled.

According to an embodiment, the receive circuit further comprises, between the receive amplifier and the analog-to-digital converter, at least one of the following elements:
  an analog gain adjustment circuit; and
  an analog anti-aliasing filter.

According to an embodiment, the receive circuit comprises an array of switched capacitors arranged upstream of the analog-to-digital converter, enabling to store analog samples representative of the output signal of the receive amplifier, prior to their digitization by the analog-to-digital converter.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
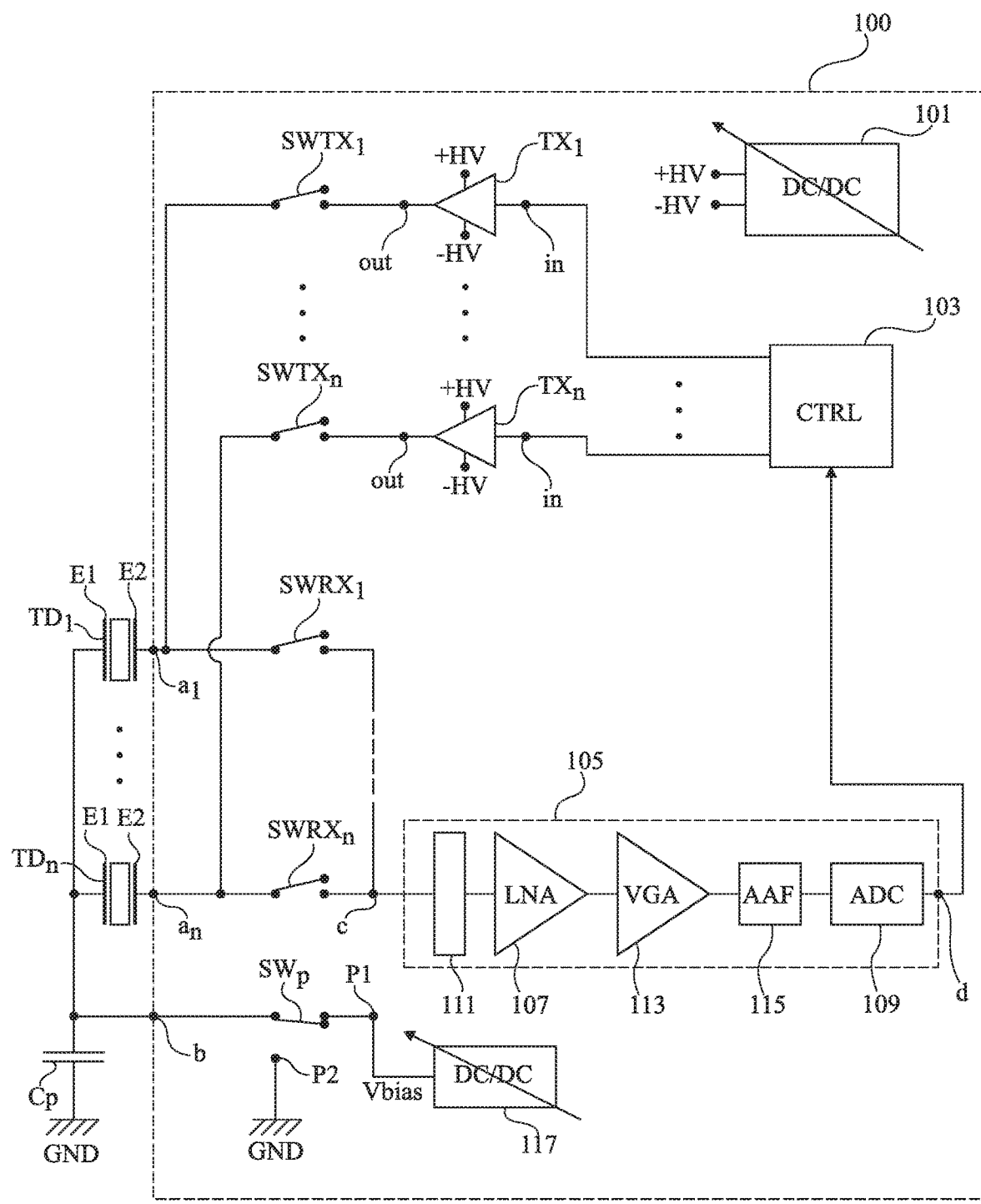
FIG. 1 is a simplified electric diagram illustrating an embodiment of an ultrasound transducer electronic control circuit.

The same elements have been designated with the same reference numerals in the different drawings. For clarity, only those elements which are useful to the understanding of the described embodiments have been shown and are detailed. In particular, the various possible applications of the control circuit have not been detailed, the described embodiments being compatible with usual applications of ultrasound imaging systems. Further, the properties (frequencies, shapes, amplitudes, etc.) of the electric excitation signals applied by the control circuit to the ultrasound transducers have not been detailed, the described embodiments being compatible with the excitation signals currently used in ultrasound imaging systems, which may be selected according to the considered application and in particular to the nature of the body to be analyzed and to the type of information which is desired to be acquired.

In the present description, the term "connected" is used to designate a direct electric connection, with no intermediate electronic component, for example, by means of one or a plurality of conductive tracks or conductive wires, and the term "coupled" or term "linked" is used to designate an electric connection which may be direct (then meaning "connected") or indirect (that is, via one or a plurality of intermediate components).

In existing ultrasound imaging systems, the transducer control electronic circuit is a circuit specifically designed for the considered application, and particularly according to the type of transducers used. Indeed, there exist different ultrasound transducer technologies, for example, piezoelectric transducers, crystal transducers, CMUT transducers (capacitive micromachined ultrasonic transducers), etc. According to the selected technology, and/or, for a given technology, according to the transducer dimensions, the constraints on the control circuit may be different, particularly as concerns the power of the excitation signals applied to the transducers, the level of the bias voltage applied to the transducers, and/or the impedance matching between the transducers and the circuit intended to read the electric response signals generated by the transducers.

The provision of a specific control signal for each ultrasound imaging application means significant development costs, and thus in a relatively high cost of the control circuit.

According to an aspect of an embodiment, an ultrasound transducer control circuit configurable or parameterizable according to the type of transducers to be controlled is provided. Such a circuit has the advantage of being usable for different applications, and in particular to control transducers in different technologies and/or having different dimensions. This enables to not have to develop a specific control circuit for each ultrasound imaging application, and thus provides an economy of scale.

FIG. 1 is a simplified electric diagram illustrating an embodiment of an ultrasound transducer electronic control circuit 100. FIG. 1 shows, in addition to control circuit 100, n ultrasound transducers $TD_1, \ldots, TD_n$ to be controlled, n being an integer greater than 1, for example, in the range from 10 to 5000, as well as a bias capacitor $C_p$. Transducers $TD_1, \ldots, TD_n$ of the system of FIG. 1 are for example identical, to within manufacturing dispersions. As an example, transducers $TD_1, \ldots, TD_n$ are piezoelectric transducers, crystal transducers, or CMUT transducers. Each ultrasound transducer $TD_i$, i being an integer ranging from 1 to n, comprises two electrodes E1 and E2. When an appropriate excitation voltage is applied between electrodes E1 and E2, the transducer emits an ultrasound acoustic wave. When the transducer receives an ultrasound acoustic wave within a given wavelength range, it supplies between its electrodes E1 and E2 a voltage representative of the received wave.

Circuit 100 comprises n terminals $a_1, \ldots, a_n$, intended to be respectively coupled to electrodes E2 of transducers $TD_1, \ldots, TD_n$. Circuit 100 further comprises a single terminal b intended to be coupled to electrodes E1 of transducers $TD_1, \ldots TD_n$. In the shown example, electrodes E2 of transducers $TD_1, \ldots, TD_n$ are respectively connected to terminals $a_1, \ldots, a_n$ of control circuit 100, and electrodes E1 of transducers $TD_1, \ldots, TD_n$ are connected to terminal b of control circuit 100.

The bias capacitor $C_p$ of the system of FIG. 1 couples terminal b of circuit 100 to a node GND of application of a reference potential of the system, for example, the ground. In the shown example, capacitor $C_p$ is external to circuit 100. As a variation, capacitor $C_p$ may be comprised within circuit 100.

Control circuit 100 of FIG. 1 comprises, for each ultrasound transducer $TD_i$, a pulse generator $TX_i$ and a controllable switch $SWTX_i$ coupling an output node out of pulse generator $TX_i$ to the terminal $a_i$ of the circuit coupled to electrode E2 of transducer $TD_i$. The pulse generators $TX_1, \ldots TX_n$ associated with the different transducers are for example identical, to within manufacturing dispersions. Further, switches $SWTX_1, \ldots, SWTX_n$ may be identical, to within manufacturing dispersions. Each pulse generator $TX_i$ comprises an input node in capable of receiving a logic control signal. When the logic signal applied to input node in of generator $TX_i$ is in a first state, generator $TX_i$ delivers on its output node out a high-level voltage +HV and, when the logic signal applied to node in of generator $TX_i$ is in a second state, generator $TX_i$ delivers on its output node out a low-level voltage −HV. As an example, voltages +HV and −HV are respectively positive and negative with respect to the reference voltage of the circuit applied to node GND. As a variation, voltage −HV is equal to the reference voltage of the circuit and voltage +HV is positive with respect to the reference voltage of the circuit. The output signal of pulse generator $TX_i$ corresponds to a signal of excitation of transducer $TD_i$, which may be applied to electrode E2 of transducer $TD_i$ via switch $SWTX_i$. The voltage level of the excitation signal is relatively high, for example, in the order of from 10 to 50 volts peak to peak (that is, between low level −HV and high level +HV). In the example of FIG. 1, circuit 100 comprises a DC/DC voltage converter (DC/DC) 101 capable of generating, from a power supply voltage (not shown) of circuit 100, for example, in the range from 1 to 5 volts, power supply voltages +HV and, possibly, −HV, of pulse generators $TX_i$. Preferably, DC/DC converter 101 is configurable to modify the level of the delivered output voltages +HV and, possibly, −HV, which enables to make circuit 100 compatible with different types of ultrasound transducers capable of receiving different excitation voltage levels. In the shown example, DC/DC converter 101 is a single converter shared by different pulse generators $TX_i$. As a variation, each pulse generator $TX_i$ may be coupled to its own DC/DC converter.

Control circuit 100 of FIG. 1 further comprises a logic control circuit 103 (CTRL) coupled to the input nodes in of the different pulse generators $TX_i$. Control circuit 103 is capable of applying logic control sequences to the different pulse generators. Circuit 103 ay individually control the different pulse generators $TX_1, \ldots, TX_n$, simultaneously or sequentially. Control circuit 103 for example comprises one or a plurality of digital processing or conditioning circuits (not detailed), for example, of microprocessor or programmable logic circuit type (for example, FPGA), and one or a plurality of memory circuits (not detailed). Control circuit 103 is for example capable of storing a plurality of predetermined transducer excitation scenarios, for example corresponding to different excitation frequencies, and capable of being selected by the user according to the envisaged application, and in particular according to the type of transducer used, and/or according to the type of body to be analyzed, and/or according to the type of searched image or information. In the case where DC/DC converter 101 is configurable, it may for example be configured by means of control circuit 103, via a configuration connection, not shown.

Electronic control circuit 100 of FIG. 1 further comprises a receive circuit 105 capable of amplifying and digitizing the electric response signals generated by the ultrasound transducers. Circuit 100 of FIG. 1 further comprises n controllable switches $SWRX_1, \ldots, SWRX_n$, respectively coupling terminals $a_1, \ldots, a_n$ to an input node c of receive circuit 105. Receive circuit 105 comprises a receive amplifier 107, preferably low noise (LNA), having its input coupled to node c, and an analog-to-digital converter 109 (ADC), having its input coupled to the output of amplifier 107 and having its output coupled to an output d (of a plurality of bits) of receive circuit 105. Output d of receive circuit 105 is coupled to control circuit 103. As an example, converter 109 is capable of supplying, on output d, digital samples quantized over from 8 to 24 bits, for example, over 14 bits, representative of the amplitude of the input signal of the converter, at a digitizing frequency in the range from 50 to 250 MHz, for example, at a 120-MHz frequency.

In the example of FIG. 1, receive circuit 105 further comprises, between node c and the input of amplifier 107, an impedance matching circuit 111 enabling, if need be, to match the input impedance of amplifier 107 to the impedance of the ultrasound transducers. Preferably, impedance matching circuit 111 is configurable, which enables to make circuit 100 compatible with different types of ultrasound transducers having different impedances. As an example, impedance matching circuit 111 comprises a configurable array of resistors and/or of capacitors. In the case where impedance matching circuit 111 is configurable, it may for example be configured by means of control circuit 103, via a configuration connection, not shown.

In the example of FIG. 1, receive circuit 105 further comprises, between the output of amplifier 107 and the input of analog-to-digital converter 109, a gain adjustment circuit 113 (VGA). Circuit 113 is for example digitally controllable by control circuit 103. Circuit 113 enables to apply a variable gain to the output signal of amplifier 107 during a phase of reading out the return signal received by an ultrasound transducer. As an example, during a phase of reading out the return signal received by an ultrasound transducer, control circuit 103 controls circuit 113 to progressively increase the gain applied to the output signal of amplifier 107. Indeed, during a phase of reception of an ultrasound signal reflected by the body to be analyzed, the amplitude of the reflected signal decreases over time, since, as time elapses, the distance traveled by the signal increases and the reflected signal is attenuated. The progressive increase of the gain applied by adjustment circuit 113 enables to maximize the amplitude of the signal applied at the input of analog-to-digital converter 109, and thus to minimize the quantization noise introduced by converter 109.

In the example of FIG. 1, receive circuit 105 further comprises an analog anti-aliasing filter 115 (AAF), for example, a low-pass filter, arranged between the output of amplifier 107 and the input of analog-to-digital converter 109. In the shown example, filter 115 is arranged between the output of gain adjustment circuit 113 and the input of converter 109.

Control circuit 100 of FIG. 1 further comprises a bias switch $SW_p$, configurable to couple node b either to a first bias node P1, or to a second bias node P2, according to the type of the transducers $TD_i$ connected to control circuit 100. Switch $SW_p$ may for example be controlled via control circuit 103.

In the example of FIG. 1, node P1 is an output node of a circuit 117 intended to supply a DC bias voltage $V_{bias}$, for example, a positive voltage with respect to the reference voltage or ground of the circuit. As an example, bias voltage $V_{bias}$ is in the range from 5 to 200 V, for example, in the order of 30 V. Such a bias voltage is particularly adapted to CMUT-type transducers. Thus, when circuit 100 is used to control CMUT-type transducers, switch $SW_p$ may be configured to connect node b to node P1. Circuit 117 is for example a DC/DC voltage converter (DC/DC), capable of generating bias voltage $V_{bias}$ from a power supply voltage (not shown) of circuit 100, for example, in the range from 1 to 5 volts. Preferably, circuit 117 is configurable to modify the level of the delivered bias voltage $V_{bias}$, which enables to make circuit 100 compatible with different types of ultrasound transducers capable of receiving different bias voltage levels or, for a given transducer type, to modify the mechanical-to-electrical conversion coefficient of the transducer. In the case where circuit 117 is configurable, the latter may for example be configured via control circuit 103.

In the example of FIG. 1, node P2 is connected to the reference node or ground GND of the circuit. Switch $SW_p$ may be configured to connect node b to node P2 when circuit 100 is used to control ultrasound transducers of piezoelectric or crystal type, since the transducers do not require being biased.

As an example, the different components of the control circuit 100 of FIG. 1 may be integrated in one or a plurality of integrated circuit chips, not shown. For example, pulse generators $TX_i$, switches $SWTX_i$ and $SWRX_i$, DC/DC converter 101, bias circuit 117, and bias switch $SW_p$ are integrated in a same integrated circuit chip, and receive circuit 105 and control circuit 103 are integrated in a same second integrated circuit chip. The described embodiments are however not limited to this specific case.

In the example of FIG. 1, control circuit 100 comprises a single receive circuit 105 shared by the different transducers $TD_1, \ldots, TD_n$. In this case, a plurality of successive ultrasound burst may be performed to acquire an image of the body to be analyzed. An example of system operation is the following. During a first ultrasound emission phase, switches $SWTX_1, \ldots, SWTX_n$ are all on (set to the conductive state) and control circuit 103 simultaneous controls pulse generators $TX_1, \ldots TX_n$ to apply excitation signals to the different transducers. To achieve this, control circuit 103 applies to the input of each pulse generator $TX_i$ a predetermined logic sequence (or bit train), representative of the excitation signal to be applied to transducer $TD_i$. The logic signal is converted by generator $TX_i$ into a pulse train of level +HV/−HV, applied to electrode E2 of transducer $TD_i$ via switch $SWTX_i$. As an example, the natural frequency, that is, the main resonance frequency of ultrasound transducers $TD_i$, is in the range from 10 to 50 MHz, for example, in the order of 30 MHz. The rate of the logic sequence applied to the input of pulse generator $TX_i$, and thus, of the pulse train applied to transducer $TD_i$, is preferably greater than four times the natural frequency of transducer $TD_i$, to be able to provide a good spectral coverage in emission mode, for example, 120 MHz for a transducer at 30 MHz. At the end of the emission phase, switches $SWTX_1, \ldots, SWTX_n$ are off (non-conductive) and a first receive switch SWRX$_i$ is turned on, the other receive switches being maintained off. The response signal generated by transducer TD$_i$ is then read and digitized via receive circuit 105 during a first receive phase. The signal may be stored by control circuit 103. The emit and receive phases are then repeated by alternating, in receive mode, the different transducers TD$_1$, . . . , TD$_n$, that is, by modifying for each iteration the address of the receive switch SWRX$_i$ controlled to the on state during the receive phase. The control of transmit and receive switches SWTX$_i$ and SWRX$_i$ is for example carried out via control circuit 103.

As a variation (not shown), control circuit 100 comprises n receive circuits 105$_1$, . . . , 105$_n$, identical or similar to the circuit 105 described hereabove, respectively coupled to the n terminals a$_1$, . . . , a$_n$. In this case, receive switches SWRX$_1$, . . . SWRX$_n$ may be omitted, each receive path 105$_i$ having its input node c connected to the corresponding terminal a$_i$. In this variation, the return signals received by the n transducers may be simultaneously read out. Thus, an image of the object to be analyzed may be obtained after a single cycle of ultrasound emission/reception by the transducers.

In another variation, control circuit 100 comprises a number r of receive circuits, intermediate between 1 and n, which enables to acquire an image of the object after n/r ultrasound emission/reception cycles.

Figure 2:
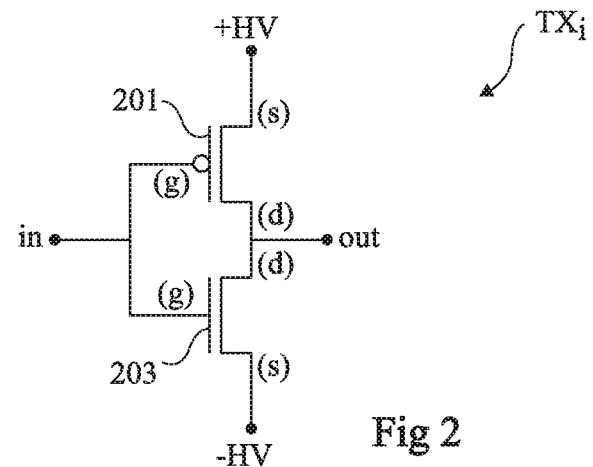
FIG. 2 is an electric diagram illustrating in further detail an embodiment of a pulse generator of the control circuit of FIG. 1.

FIG. 2 is an electric diagram illustrating in further detail an embodiment of a pulse generator TX$_i$ of control circuit 100 of FIG. 1. In this example, pulse generator TX$_i$ is a push-pull assembly made up of MOS transistors. More particularly, the pulse generator TX$_i$ of FIG. 2 comprises a P-channel MOS transistor 201 and an N-channel MOS transistor 203. Transistor 201 has its source (s) coupled to a node of application of high power supply voltage +HV of the generator and its drain (d) coupled to the drain (d) of transistor 203. Transistor 203 has its source (s) coupled to a node of application of low power supply voltage −HV of the generator. The gate (g) of transistor 201 is further coupled to the gate (g) of transistor 203. Input node in of pulse generator TX$_i$ is coupled to the node common to the gates of transistors 201 and 203, and output node out of pulse generator TX$_i$ is coupled to the node common to the sources of transistors 201 and 203.

As a variation, a similar assembly may be formed by replacing transistor 201 with an NPN-type bipolar transistor and transistor 203 with a PNP-type bipolar transistor.

Figure 3:
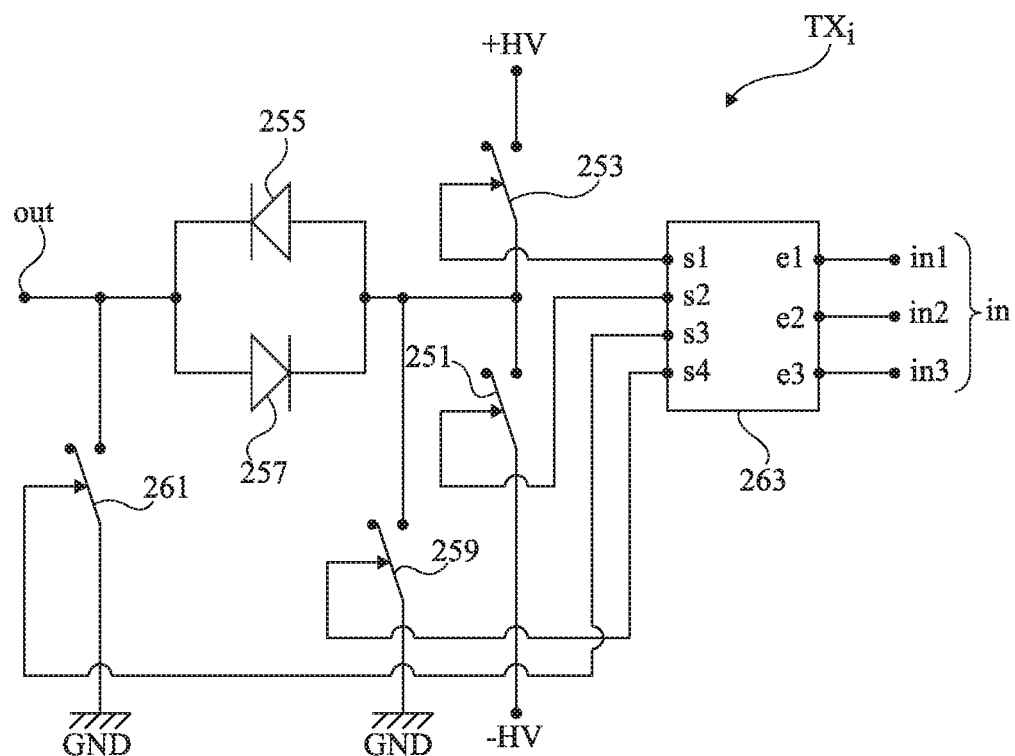
FIG. 3 is an electric diagram illustrating in further detail another embodiment of a pulse generator of the control circuit of FIG. 1.

FIG. 3 is an electric diagram illustrating in further detail another embodiment of a pulse generator TX$_i$ of control circuit 100 of FIG. 1.

In this example, pulse generator TX$_i$ comprises two controlled switches 251 and 253, for example, MOS transistors or bipolar transistors, series-connected between a node of application of the low power supply voltage −HV of the generator, and a node of application of the high power supply voltage +HV of the generator. More particularly, in the shown example, switch 251 has a first conduction node connected to node −HV and a second conduction node, and switch 253 has a first conduction node connected to the second conduction node of switch 251 and a second conduction node connected to node +HV. Pulse generator TX$_i$ further comprises two diodes 255 and 257 coupled in antiparallel between the junction point of switches 251 and 253 and output node out of the generator. More particularly, in the shown example, diode 255 has its anode connected to the common conduction node between switches 251 and 253 and has its cathode connected to node out, and diode 257 has its anode connected to node out and its cathode connected to the common conduction node between switches 251 and 253. The pulse generator TX$_i$ of FIG. 3 further comprises a controlled switch 259, for example, a MOS transistor or a bipolar transistor coupling, by its conduction nodes, the junction point of switches 251 and 253 to reference node GND, and a controlled switch 261, for example, a MOS transistor or a bipolar transistor coupling, by its conduction nodes, node out to node GND. Pulse generator TX$_i$ further comprises a logic circuit 263 with three binary inputs e1, e2, e3 and three binary outputs s1, s2, s3, s4. Outputs s1, s2, s3, and s4 of circuit 263 are respectively coupled to the control nodes of switches 253, 255, 261, and 259 to control the transistors. In this example, logic signal in of control of pulse generator TX$_i$, supplied by control circuit 103 of FIG. 1, is a signal over three bits in1, in2, in3, bits in1, in2, in3 being respectively applied to inputs e1, e2, e3 of logic circuit 263 of the generator. More particularly, binary signal in1 is a logic signal intended to control switch 253, binary signal in2 is a logic signal intended to control switch 251, and binary signal in3 is a signal intended to control switch 261.

Logic circuit 263 has the function of transposing the logic signals in1, in2, in3 supplied by control circuit 103, into effective control signals of switches 251, 253, 259, and 261 of pulse generator TX$_i$.

More particularly, in a transmission or excitation phase, control circuit 103 applies to node e3 of circuit 263 a signal in3 intended to control switch 261 to the off state. Logic circuit 263 then controls, via its output node s3, switch 261 to the off state. Switches 253 and 251 are controlled, via nodes s1 and s2, according to the state of signals in1 and in2. More particularly, circuit 263 directly transmits input signals in1 and in2 to its output nodes s1 and s2. In emission phase, circuit 263 further controls switch 259 via its output node s4, so that switch 259 is off when at least one of switches 251 and 253 is on and is on when switches 251 and 253 are both off.

In receive phase, control circuit 103 applies to node e3 of circuit 263 a signal in3 intended to control switch 261 to the off state. Logic circuit 263 then controls, via its output node s3, switch 261 to the off state and, via its output node s4, switch 259 to the on state. Switches 259 and 261 remain respectively on and off independently from the state of the input signals in1 and in2 applied to inputs nodes e1 and e2 of circuit 263.

In this example, diodes 255 and 257 form, in receive phase, a potential barrier for the return signals generated by the transducers, to avoid for part of the power of the return signal to be lost in the pulse generator.

As an example, the logic function f implemented by circuit 263, such that {s1, s2, s3, s4}=f({e1, e2, e3}), is defined by the following truth table:

| e1 | e2 | e3 | s1 | s2 | s3 | s4 |
|----|----|----|----|----|----|----|
| x  | x  | 1  | 0  | 0  | 1  | 1  |
| 0  | 0  | 0  | 0  | 0  | 0  | 1  |
| 0  | 1  | 0  | 0  | 1  | 0  | 0  |
| 1  | 0  | 0  | 1  | 0  | 0  | 0  |
| 1  | 1  | 0  | 0  | 0  | 0  | 1  | where values 1 and 0 respectively designate a turn-on control signal and a turn-off control signal, and where value x may be indifferently equal to 1 or to 0.

Figure 4A:
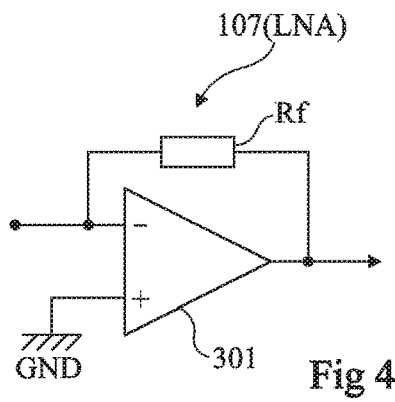
FIGS. 4A, 4B, and 4C are electric diagrams illustrating in further detail three alternative embodiments of a receive amplifier of the control circuit of FIG. 1.
Figure 4B:
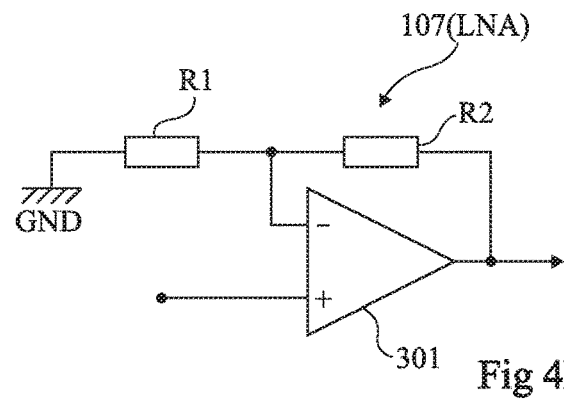
Figure 4C:
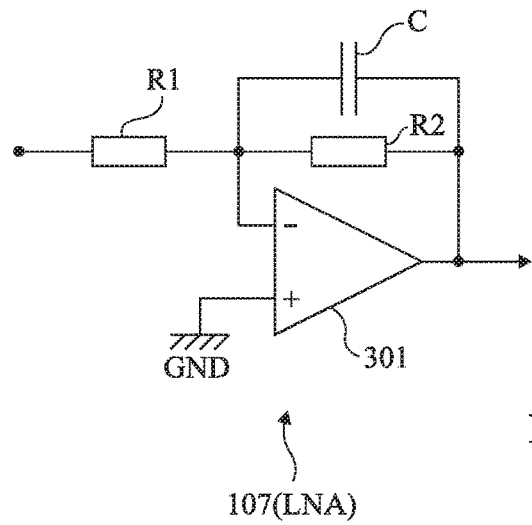

FIGS. 4A, 4B, and 4C are electric diagrams illustrating in further detail three alternative embodiments of the receive amplifier 107 (LNA) of the control circuit 100 of FIG. 1.

FIG. 4A illustrates a first embodiment of amplifier 107. In this example, amplifier 107 is an amplifier of transimpedance type. It comprises an operational amplifier 301 having its inverting input (−) coupled to the output via a resistor Rf. The inverting input of operational amplifier 301 is coupled to the input of amplifier 107, and the output of operational amplifier 301 is coupled to the output of amplifier 107. The non-inverting input (+) of operational amplifier 301 is coupled to reference node GND of the circuit.

FIG. 4B illustrates another embodiment of amplifier 107. In this example, amplifier 107 is a buffer-type amplifier. It comprises an operational amplifier 301 having its inverting input (−) coupled on the one hand to reference node GND via a resistor R1, and on the other hand to its output via a resistor R2. The non-inverting input (+) of operational amplifier 301 is coupled to the input of amplifier 107, and the output of operational amplifier 301 is coupled to the output of amplifier 107.

FIG. 4C illustrates another embodiment of amplifier 107. In this example, amplifier 107 is an amplifier of charge amplifier type. It comprises an operational amplifier 301 having its inverting input (−) coupled on the one hand to the input of amplifier 107 via a resistor R1, and on the other hand to its output via a resistor R2 and a capacitor C connected in parallel with resistor R2. The non-inverting input (+) of operational amplifier 301 is coupled to reference node GND of the circuit. The output of operational amplifier 301 is coupled to the output of amplifier 107.

The selection of the type of amplifier 107 among the assemblies of FIGS. 4A, 4B, and 4C may be made according to the impedance of the ultrasound transducers intended to be controlled by circuit 100. In particular, the assemblies of FIGS. 4A and 4C are particularly adapted to transducers having high impedances, for example, greater than 2 kΩ, while the assembly of FIG. 4B is adapted to transducers having a smaller impedance, for example, in the range from 200Ω to 2 kΩ. As an example, the receive circuit 105 of control circuit 100 may comprise a plurality of different receive amplifiers 107, and a multiplexing circuit configurable to select the receive amplifier 107 to be used according to the type of transducers used.

Figure 5:
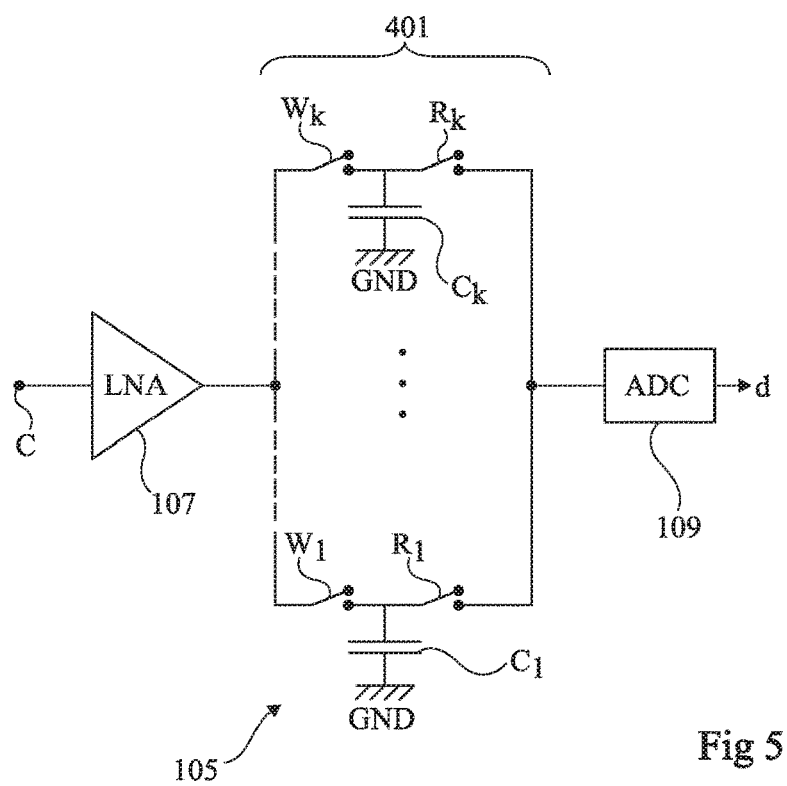
FIG. 5 is an electric diagram illustrating an alternative embodiment of a receive circuit of the control circuit of FIG. 1.

FIG. 5 is an electric diagram illustrating an alternative embodiment of the receive circuit 105 of control circuit 100 of FIG. 1. In the shown example, for simplification, impedance matching circuit 111, gain adjustment circuit 113, and anti-aliasing filter 115 have not been shown.

The receive circuit 105 of FIG. 5 differs from the receive circuit 105 of FIG. 1 mainly in that it further comprises, between amplifier 107 and analog-to-digital converter 109, a switched-capacitor array 401 enabling to store in analog fashion samples of the output signal of amplifier 107, prior to their digitization by converter 109. An advantage of the variation of FIG. 5 is that it enables to decrease the operating frequency of analog-to-digital converter 109, and thus the electric power consumed by the converter.

In the shown example, switched capacitor array 401 comprises K capacitors $C_1, \ldots, C_K$, K being an integer greater than 1, and, for each capacitor $C_j$, j being an integer in the range from 1 to K, a write switch $W_j$ coupling a first electrode of the capacitor to the output of amplifier 107, and a readout switch $R_j$ coupling the second electrode of the capacitor to the input of analog-to-digital converter 109. Switches $W_j$ and $R_j$ are for example controlled by control circuit 103. In operation, samples of the analog output signal of amplifier 107 are successively stored into the different capacitors $C_j$ of array 401, at the desired sampling frequency of the electric response signal generated by the transducer connected to the receive circuit. The analog samples are then successively digitized by analog-to-digital converter 109, at a frequency smaller than the analog signal sampling frequency. As an example, number K of capacitors of capacitor array 401 is equal to the number of samples of the electric response signal which is desired to be acquired during an ultrasound wave emission/reception sequence.

In the case where receive circuit 105 comprises at least one of elements 113 and 115 (FIG. 1), the array of switched capacitors 401 may be arranged downstream of these elements, that is, between these elements and analog-to-digital converter 109.

In the case where control circuit 100 comprises a plurality of receive paths 105, each receive path may comprise an array of switched capacitors 401 of the type described in relation with FIG. 5.

Specific embodiments have been described. Various alterations, modifications, and improvements will occur to those skilled in the art. In particular, the described embodiments are not limited to the numerical examples of operating frequencies and/or of voltage level mentioned in the description.

It should further be noted that the above-described embodiments may be adapted whatever the arrangement of the ultrasound transducers to be controlled. In particular, the described embodiments are compatible with arrangements in a linear array or in a matrix array of the ultrasound transducers.

Further, in the above-described embodiments, control circuit 100 may be used to control parallel associations of a plurality of ultrasound transducers. More particularly, in the example of FIG. 1, a plurality of ultrasound transducers coupled in parallel may be connected between each individual control terminal a1 and the common terminal b of control circuit 100.

It should further be noted that the provision, in receive circuits 105, of an array of switched capacitors 401 arranged upstream of analog-to-digital converter 109, enabling to store analog signals representative of the output signal of receive amplifier 107 prior to their digitization by the analog-to-digital converter, such as described in relation with FIG. 5, is advantageous including in an ultrasound transducer control circuit which is not configurable according to the type of transducer to be controlled. Thus, it is possible to provide an ultrasound transducer control circuit which is not configurable according to the type of transducer to be controlled, and in particular which does not comprise the bias switch $SW_p$ of FIG. 1, where the receive circuit comprises an array of switched capacitors 401 such as described in relation with FIG. 5.

The invention claimed is:

1. A circuit of control of ultrasound transducers, comprising:
    a first terminal intended to be coupled to a first electrode of each of the transducers, and a bias switch configurable to couple the first terminal to one or the other of first and second bias nodes;
    a plurality of second terminals intended to be respectively coupled to second electrodes of the transducers to be controlled; and
    a receive circuit comprising an input node, a receive amplifier having its input coupled to the input node, an analog-to-digital converter having its input coupled to the output of the receive amplifier, an output coupled to the output of the analog-to-digital converter, and an impedance matching circuit configurable according to the type of transducers to be controlled.

2. The control circuit of claim 1, further comprising a circuit intended to supply a DC bias voltage having an output node connected to the first bias node, and wherein the second bias node is a node of application of a reference potential of the control circuit.

3. The control circuit of claim 2, wherein the circuit intended to supply a DC bias voltage comprises a DC/DC voltage converter configurable to modify the level of the DC bias voltage that it delivers.

4. The control circuit of claim 1, further comprising a plurality of voltage pulse generators, each of the second terminals being coupled to one of the voltage pulse generators.

5. The control circuit of claim 4, wherein the voltage level of the voltage pulses delivered by the pulse generators is configurable.

6. The control circuit of claim 1, further comprising a plurality of switches respectively coupling the second terminals to the input node of the receive circuit.

7. The control circuit of claim 1, wherein the receive circuit further comprises an array of switched capacitors arranged upstream of the analog-to-digital converter, enabling to store analog samples representative of the output signal of receive amplifier prior to their digitization by the analog-to-digital converter.

8. A circuit of control of ultrasound transducers, comprising:
   a first terminal intended to be coupled to a first electrode of each of the transducers, and a bias switch configurable to couple the first terminal to one or the other of first and second bias nodes;
   a plurality of second terminals intended to be respectively coupled to second electrodes of the transducers to be controlled; and
   a receive circuit comprising an input node, a receive amplifier having its input coupled to the input node, an analog-to-digital converter having its input coupled to the output of the receive amplifier, an output coupled to the output of the analog-to-digital converter, and between the receive amplifier and the analog-to-digital converter, at least one of:
      an analog gain adjustment circuit; and
      an analog anti-aliasing filter.

9. The control circuit of claim 8, wherein the receive circuit further comprises an array of switched capacitors arranged upstream of the analog-to-digital converter, enabling to store analog samples representative of the output signal of receive amplifier prior to their digitization by the analog-to-digital converter.

10. The control circuit of claim 8, further comprising a circuit intended to supply a DC bias voltage having an output node connected to the first bias node, and wherein the second bias node is a node of application of a reference potential of the control circuit.

11. The control circuit of claim 10, wherein the circuit intended to supply a DC bias voltage comprises a DC/DC voltage converter configurable to modify the level of the DC bias voltage that it delivers.

12. The control circuit of claim 8, further comprising a plurality of voltage pulse generators, each of the second terminals being coupled to one of the voltage pulse generators.

13. The control circuit of claim 12, wherein the voltage level of the voltage pulses delivered by the pulse generators is configurable.

14. The control circuit of claim 8, further comprising a plurality of switches respectively coupling the second terminals to the input node of the receive circuit.

* * * * *